(12) United States Patent
Yang et al.

(10) Patent No.: US 8,882,055 B2
(45) Date of Patent: Nov. 11, 2014

(54) COLLAPSIBLE CABLE MANAGEMENT ARM

(71) Applicant: Echostreams Innovative Solutions, City of Industry, CA (US)

(72) Inventors: Chin-Hao Yang, New Taipei (TW); Hsiao-Fen Peng, New Taipei (TW); Chang-Feng Chu, Taoyuan County (TW); Chia-Hung Liu, New Taipei (TW); Mu-Chuan Wang, New Taipei (TW)

(73) Assignee: Echostreams Innovative Solutions, City of Industry, CA (US)

( * ) Notice: Subject to any disclaimer, the term of this patent is extended or adjusted under 35 U.S.C. 154(b) by 97 days.

(21) Appl. No.: 13/655,421

(22) Filed: Oct. 18, 2012

(65) Prior Publication Data

US 2013/0341471 A1    Dec. 26, 2013

(30) Foreign Application Priority Data

Jun. 20, 2012  (TW) .............................. 101211856 U

(51) Int. Cl.
*F16L 3/08* (2006.01)

(52) U.S. Cl.
USPC ....... 248/70; 248/282.1; 248/276.1; 361/826; 174/69

(58) Field of Classification Search
CPC ........... F16L 3/015; F16L 3/10; H05K 7/1491
USPC ............... 248/70, 65, 276.1, 282.1; 361/826; 211/26; 174/69
See application file for complete search history.

(56) References Cited

U.S. PATENT DOCUMENTS

| | | | | |
|---|---|---|---|---|
| 6,305,556 | B1 * | 10/2001 | Mayer | 211/26 |
| 6,326,547 | B1 * | 12/2001 | Saxby et al. | 174/69 |
| 6,600,665 | B2 * | 7/2003 | Lauchner | 361/826 |
| 6,805,248 | B2 * | 10/2004 | Champion et al. | 211/26 |
| 6,902,069 | B2 * | 6/2005 | Hartman et al. | 211/26 |
| 7,026,551 | B2 * | 4/2006 | Franz et al. | 174/69 |
| 7,168,576 | B2 * | 1/2007 | Williams | 211/26 |
| 7,472,795 | B2 * | 1/2009 | Dubon et al. | 211/26 |
| 7,473,846 | B2 * | 1/2009 | Doerr et al. | 174/69 |

* cited by examiner

*Primary Examiner* — Anita M King
(74) *Attorney, Agent, or Firm* — Li & Cai Intellectual Property (USA) Office

(57) ABSTRACT

A collapsible cable management arm is foldable with a plurality of heat dissipation apertures. The collapsible cable management arm includes a plurality of racks pivotally connected together which gives a zigzag chain structure being retractable. The rack is formed by a primary and a secondary plate. The secondary plate resembles the size and shape of the primary plate. The secondary plate slides into the tray-like primary plate to form the individual rack with hollow compartment there-between. The thickness of the rack arises from a primary positioning portion of the primary plate. The hollow compartment is further divided into connection and cable compartments by at least one pair of primary and secondary partitions.

18 Claims, 8 Drawing Sheets

COLLAPSIBLE CABLE MANAGEMENT ARM

BACKGROUND

1. Field of the Invention

The instant disclosure relates to a collapsible cable management device; in particular, to a collapsible cable management arm for organizing various internal cables.

2. Description of Related Art

The demand of computer network and telecommunication device is ever-increasing and an issue arises in the organization of cables, electrical cords and the like. The lengthy cables are prone to tangle when loosely disposed in an industrial computer server which usually has considerable number of power and signal cables therein connecting hard disk drives. In addition, cables have to be disconnected from at least one end for equipment maintenance resulting in a period of power cut or service interruption.

The conventional cable tray comprises trays or tubes to retain cables. However, the known apparatuses have limited capability of heat dissipating which cause slow signal transmission speed and even electric fire. Furthermore, the fixed trays or tubes are less flexible and occupying larger storage space.

SUMMARY OF THE INVENTION

The object of the instant disclosure is to provide a collapsible cable management arm to organize cables neatly and minimize the storage space inside a system by a foldable metal retainer arm, which allows the subassembly within the system to be extracted forward like a drawer with all the cables attached without disconnecting the power and signal. Furthermore, the collapsible cable management arm allows better airflow within the system by clamping down the evenly-spaced cables to yield airflow channels.

According to one exemplary embodiment of the instant disclosure, the collapsible cable management arm comprises a primary plate including at least one primary spacer and a positioning portion. The primary positioning portion has a first primary positioning rail and a second primary positioning rail. The pair of the first and second primary positioning rails extends perpendicularly from the opposite edges of the primary plate. The first primary positioning rail has a first head end and a first tail end. Likewise, the second primary positioning rail has a second head end and a second tail end. The first head end and the second head end are concentric to a first axis. The first tail end and the second tail end are concentric to a second axis. The collapsible cable management arm also comprises a secondary plate, which includes at least one secondary connection portion and a secondary positioning portion. The secondary positioning portion has a first secondary positioning rail and a second secondary positioning rail. The pair of the first and second secondary positioning rails extends perpendicularly from the opposite edges of the secondary plate. The secondary plate slides into the tray-like primary plate contacting the primary positioning portion by the secondary positioning portion. The primary and secondary plates are connected by the primary and secondary connection portion to form a rack, which has a hollow compartment with two open ends. The thickness of the rack comes from the width of the primary and secondary positioning portion. The collapsible cable management arm comprises at least two of the racks pivotally connected to each other.

The collapsible cable management arm may act as a removable member inside a system (for example, a hard disk drawer in an industrial server). When the cable management arm is folded, the uniformed structure forms channels to prevent physical blockage. In addition, cables retained in the cable management arm are inhibited from sideway movement. In other words, the cables do not get skewed or jammed as in the conventional cable tray. The smooth turns and uniformed channels of the cable management arm also prevent the cable from sharp turns therefore reducing cable kinks or cut when clamped. More specifically, the signal and power flows remain stable and lossless. In short, the collapsible cable management arm provides an enhanced cooling system and reliable retaining manner for stable signal and power transmission.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
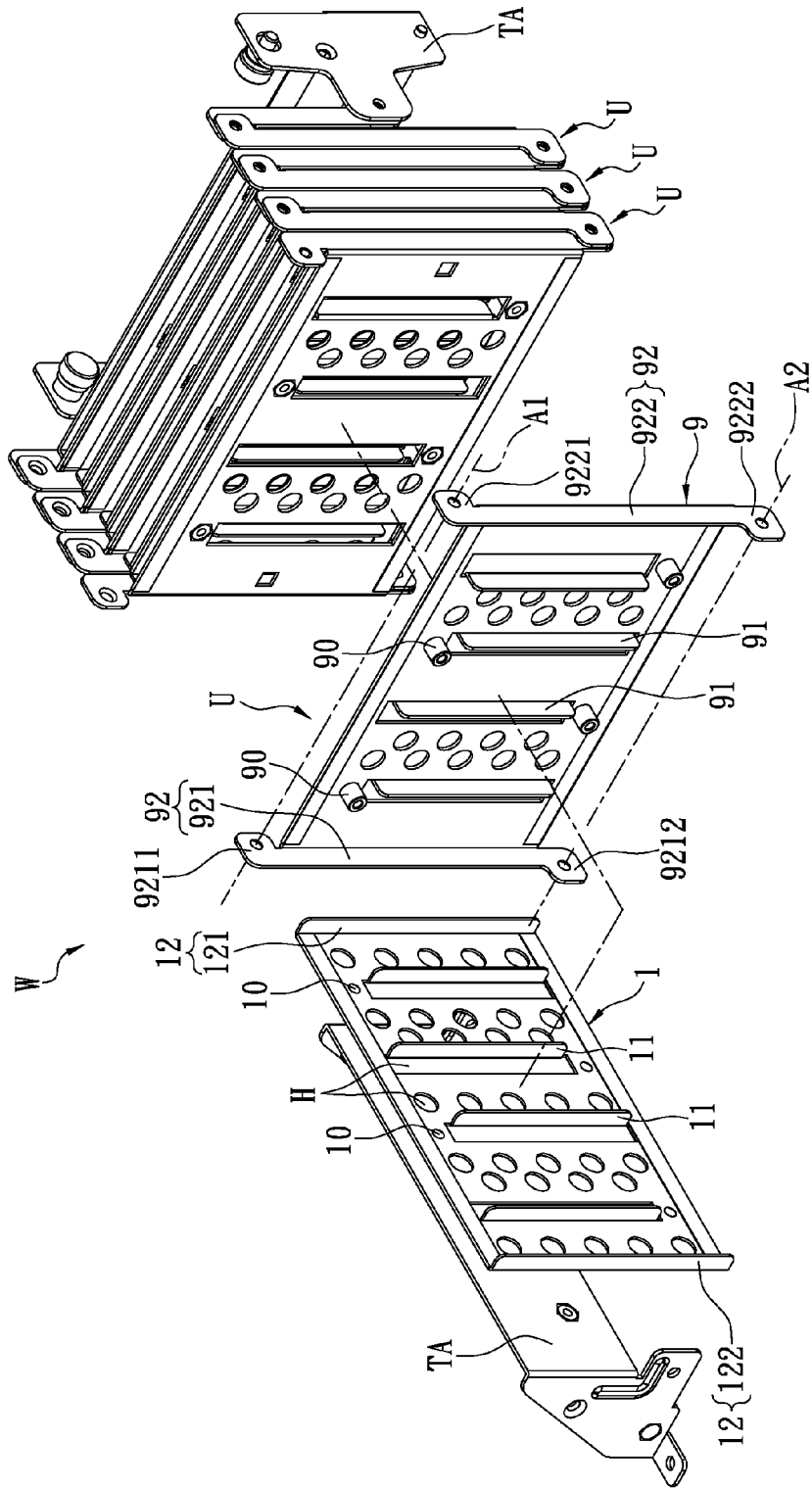
FIG. 1 is an exploded view of a collapsible cable management arm in accordance with the instant disclosure.
Figure 2:
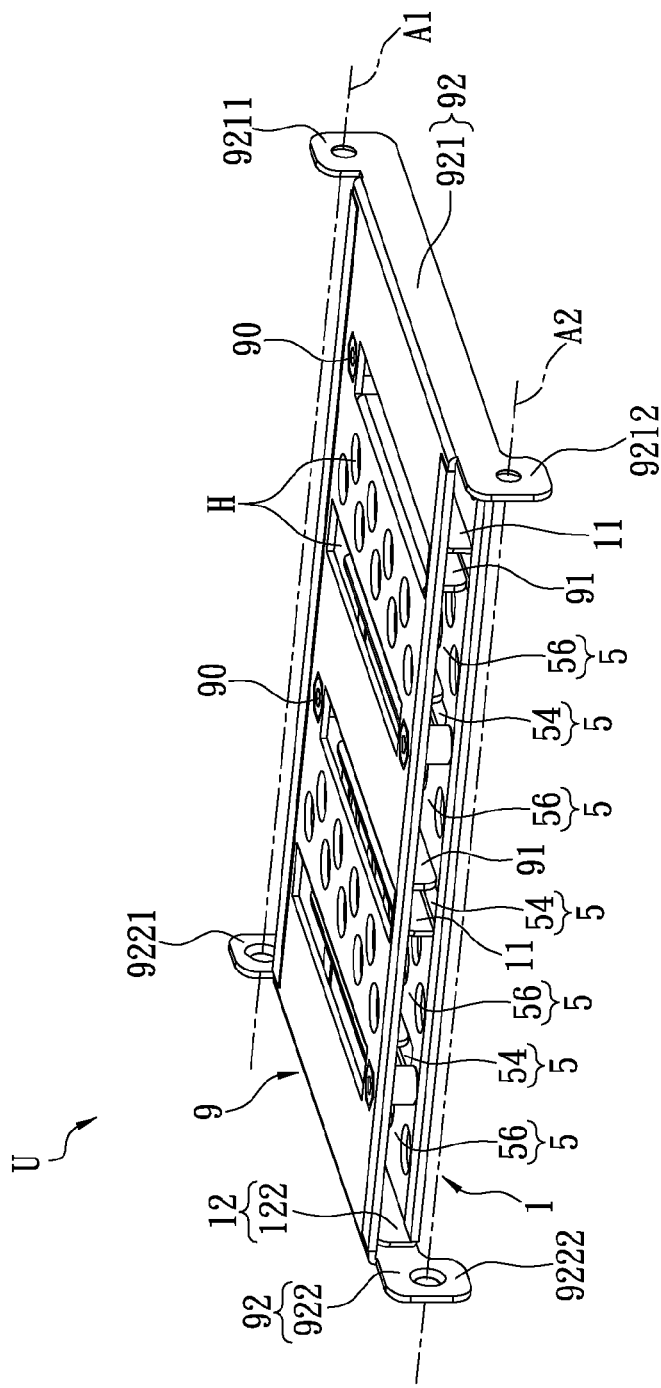
FIG. 2 is a perspective view of a rack in accordance with the instant disclosure.
Figure 3:
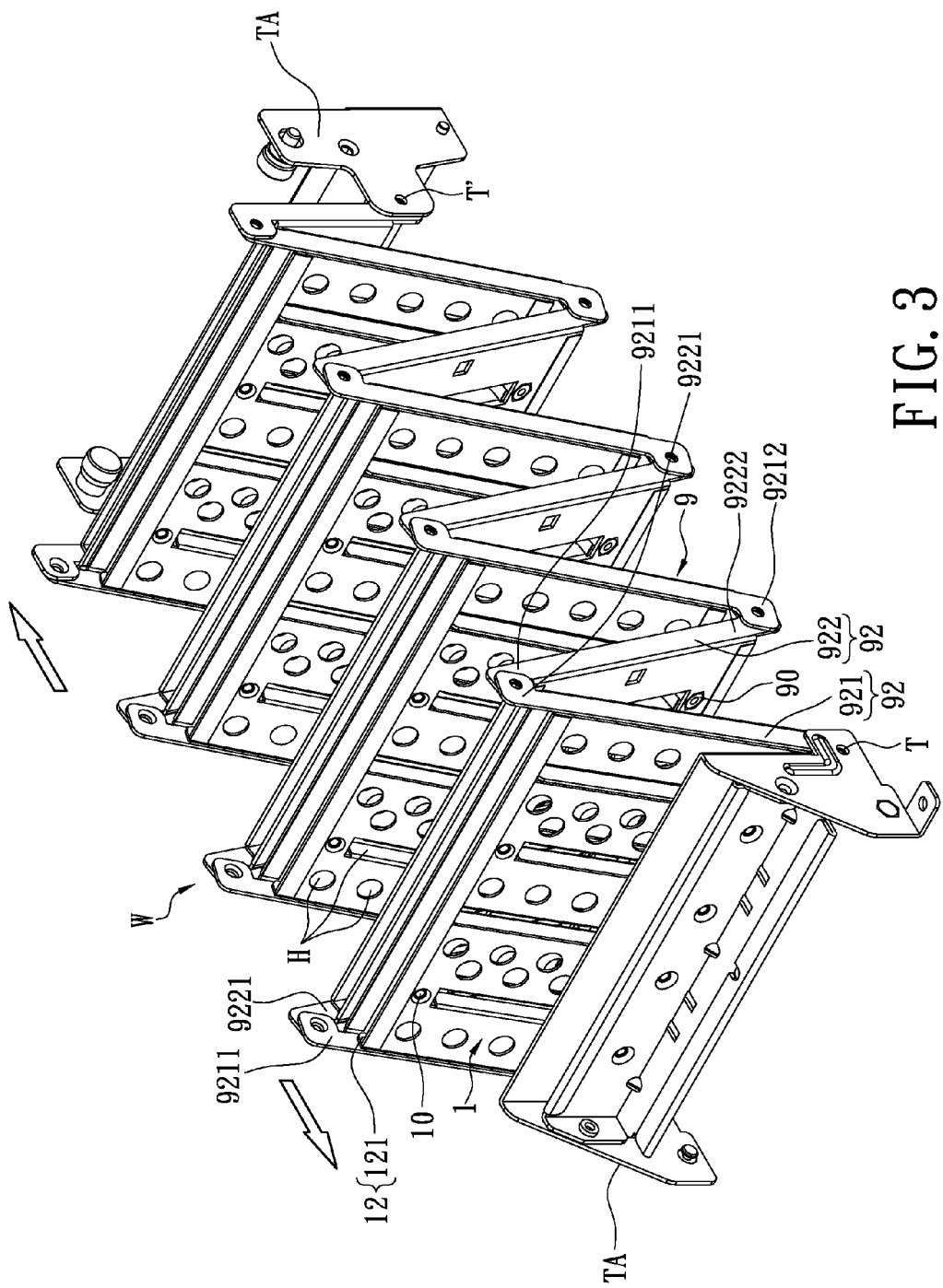
FIG. 3 is a perspective view of a collapsible cable management arm in a stretched position in accordance with the instant disclosure.

Please refer to FIG. 1 in conjunction with FIG. 2. FIG. 1 shows an embodiment of a collapsible cable management arm W in accordance with the instant disclosure, while FIG. 2 shows a rack segment U of the rack W. The rack segment U comprises a primary plate 9 and a secondary plate 1. Preferably, the primary plate 9 is substantially rectangular and includes a primary positioning portion 92 for retaining relative position between the primary and secondary plates, and at least one primary spacer 90 for establishing connection with the secondary plate 1.

In the instant embodiment, the primary positioning portion 92 includes a first primary positioning rail 921 and a second primary positioning rail 922 disposed on opposite sides of the primary plate 9 and substantially perpendicular thereto. The first primary positioning rail 921 has a first head end 9211 and a first tail end 9212. Likewise, the second primary positioning rail 922 has a second head end 9221 and a second tail end 9222. The first and second head ends 9211, 9221 are arranged on a first rotational axis A1. The first and second tail ends 9212, 9222 are arranged on a second rotational axis A2.

The secondary plate 1 includes at least one secondary connection portion 10 and a secondary positioning portion 12. The secondary positioning portion 12 includes a first secondary positioning rail 121 and a second secondary positioning rail 122 disposed in the opposite sides of the secondary plate 1 and substantially perpendicular thereto.

The primary plate 9 acts as a tray and the secondary plate 1 slides therein contacting the primary positioning portion 92 and connected via the primary and secondary connection portions 90, 10. The primary and secondary plates 9, 1 together form the rack U with a hollow compartment 5 and two open ends. The thickness of the hollow compartment 5 arises from the width of the primary and secondary positioning portion 92, 12.

The primary plate 9 also includes at least one primary partition 91 stretching inwardly to the hollow compartment 5 and parallel to the primary positioning portion 92. The secondary plate 1 includes at least one secondary partition 11 stretching inwardly to the hollow compartment 5 and parallel to the secondary positioning portion 12. The primary and secondary partition 91, 11 are parallelly spaced apart, defining a connection compartment 54 there-between and dividing the hollow compartment 5 into two cable compartments 56. In an embodiment of the instant disclosure, four pairs of the primary and secondary partitions 91, 11 define four connection compartments 54 there-between and five cable compartments 56.

Figure 6:
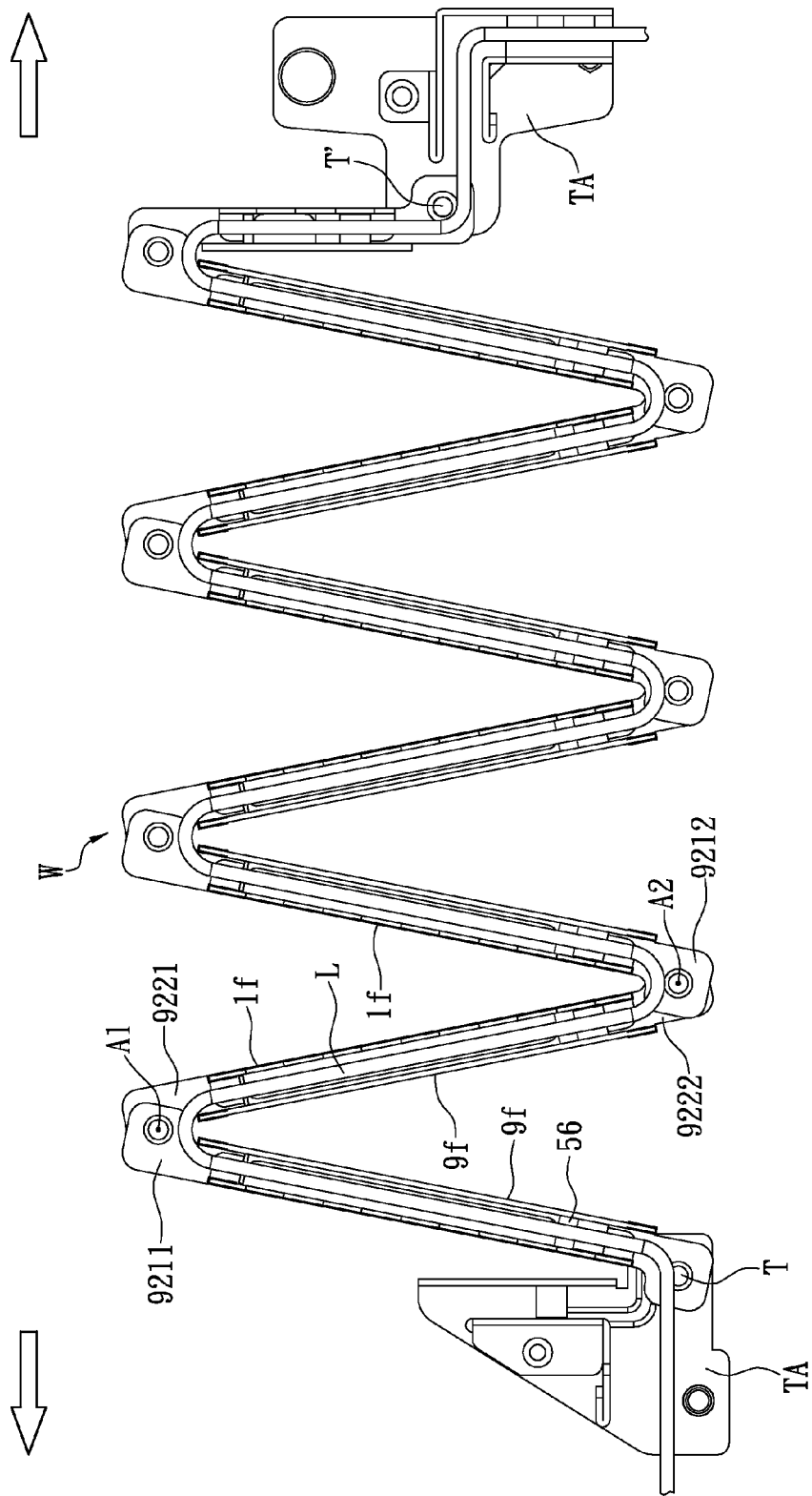
FIG. 6 is a cross-sectional view of a collapsible cable management arm retaining cables in a stretched position in accordance with the instant disclosure.
Figure 7:
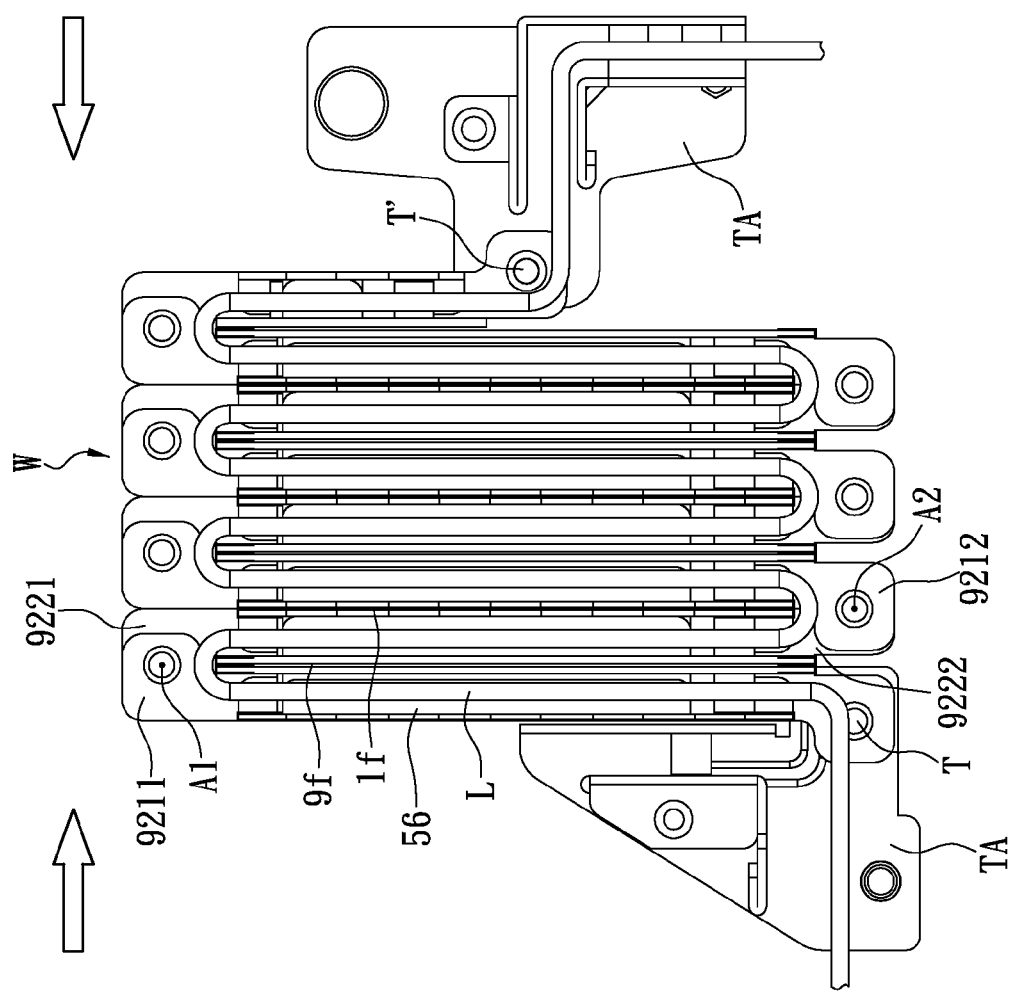
FIG. 7 is a cross-sectional view of a collapsible cable management arm retaining cables in a contracted position in accordance with the instant disclosure.

Please refer to FIG. 6 in conjunction with FIG. 7. The first axis A1 and the primary plate surface 9*f* are co-planar. The second axis A2 and the secondary plate surface 1*f* are co-planar as well.

Please refer back to FIG. 1 in conjunction with FIG. 2. The primary and secondary plates 9, 1 further includes apertures H for better heat dissipation. The apertures H can vary in size as well as shape and in the embodiment, round and rectangular apertures H are used.

Figure 5:
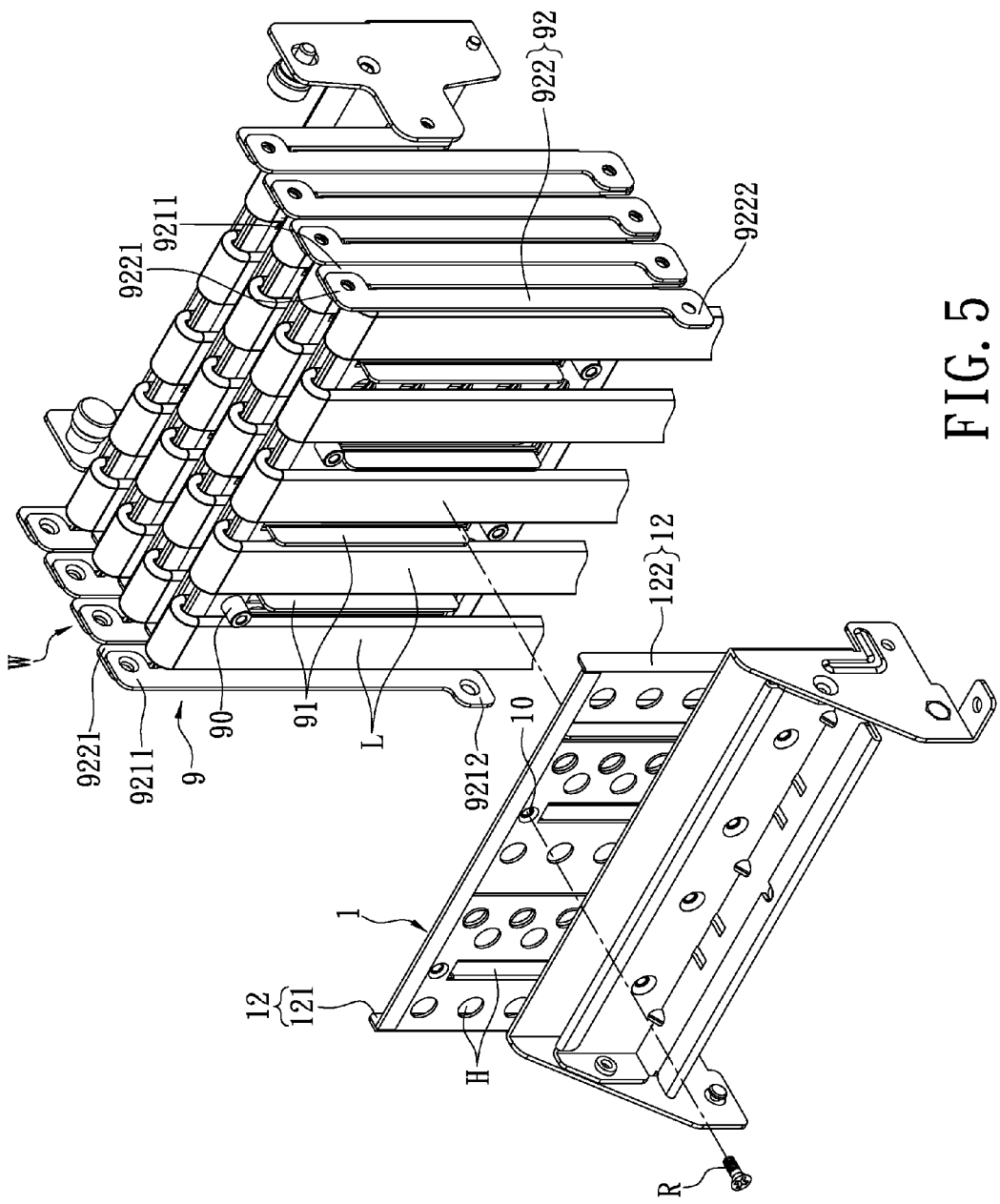
FIG. 5 is an exploded view of a collapsible cable management arm retaining cables in accordance with the instant disclosure.

The primary and secondary plates 9, 1 are affixed together via the primary and secondary connection portion 90, 10 by screws R (as shown in FIG. 5) or tenon (not shown).

Figure 4:
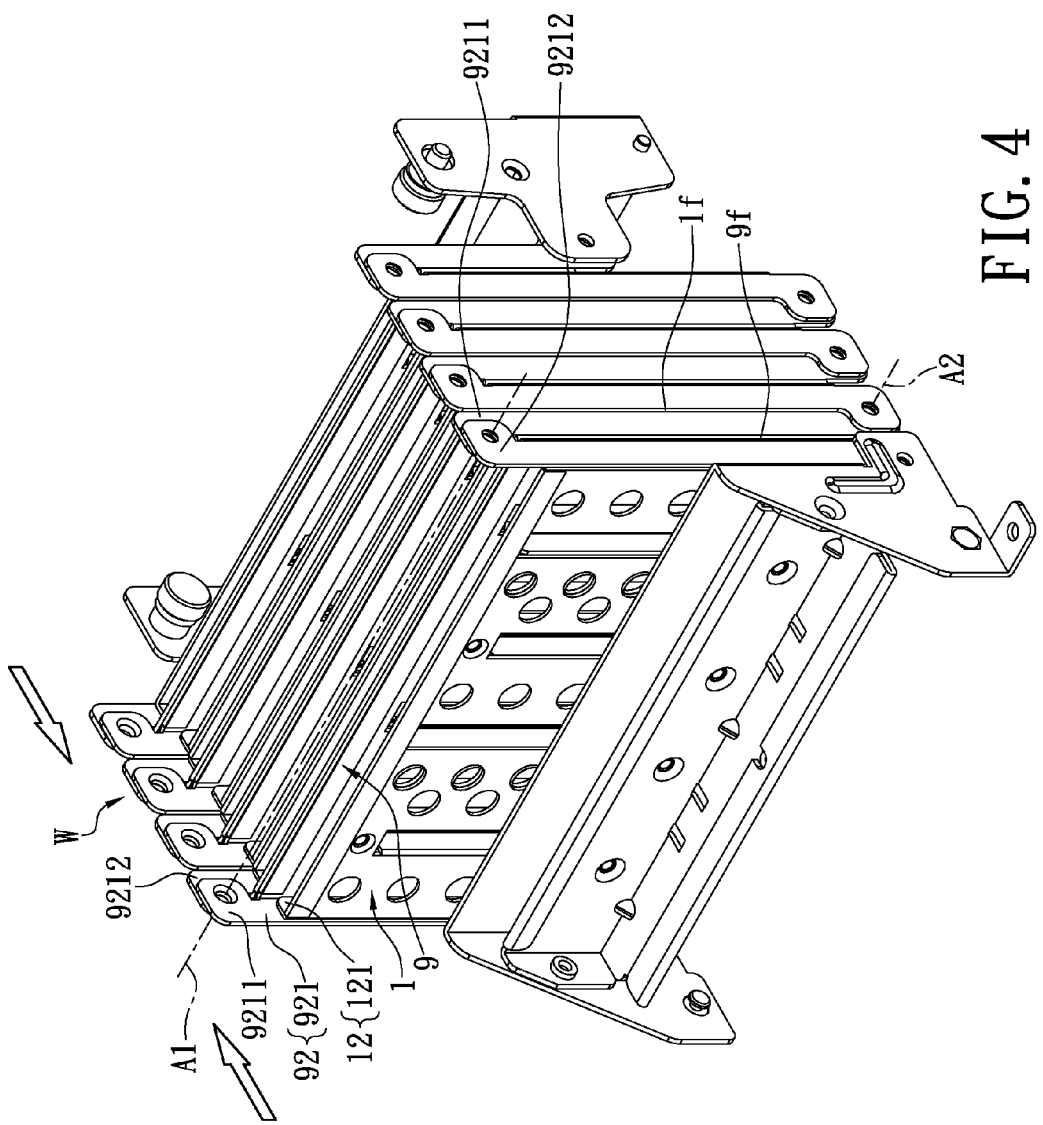
FIG. 4 is a perspective view of a collapsible cable management arm in a contracted position in accordance with the instant disclosure.

The collapsible cable management arm W comprises at least a pair of racks U pivotally connected together. Please refer to FIG. 4, FIG. 6 and FIG. 7. Each of the racks U is joined by the primary positioning rail 921 in a head-to-head, tail-to-tail manner. That is to say, each of the first head ends 9211 is connected to the second head end 9221 of one adjacent rack U by pivot pins; meanwhile, each of the first tail end 9212 is connected to the second tail end 9222 of another adjacent rack U by pivot pins as well. Therefore, the collapsible cable management arm W is in a zigzag chain structure able to be folded. The chain structure provides the advantage of minimizing the volume when retracted because each of the racks U is stacked face-to-face tightly.

The cable management arm W further comprises a first holder T and a second holder T' which are equivalent to the unconnected head and tail ends. The first and second holders T, T' are attached to fastening seats TA respectively so the collapsible cable management arm W can be affixed to different objects. The fastening seat TA engages an object by tenon or screws and the connection means thereof are not limited thereto.

Please refer to FIG. 5 of an exploded diagram of the collapsible cable management arm W. Cables L are disposed in between the primary partitions 91 separately. The secondary plate 1 is secured on the primary plate 9 via screws and the connection means there-between are not limited thereto. As the rack U is formed, the cables L are in the cable compartments 56 as shown in FIG. 2. The cables L stretch and contract in the same motion as the collapsible cable management arm W and are protected and organized therein.

Figure 8:
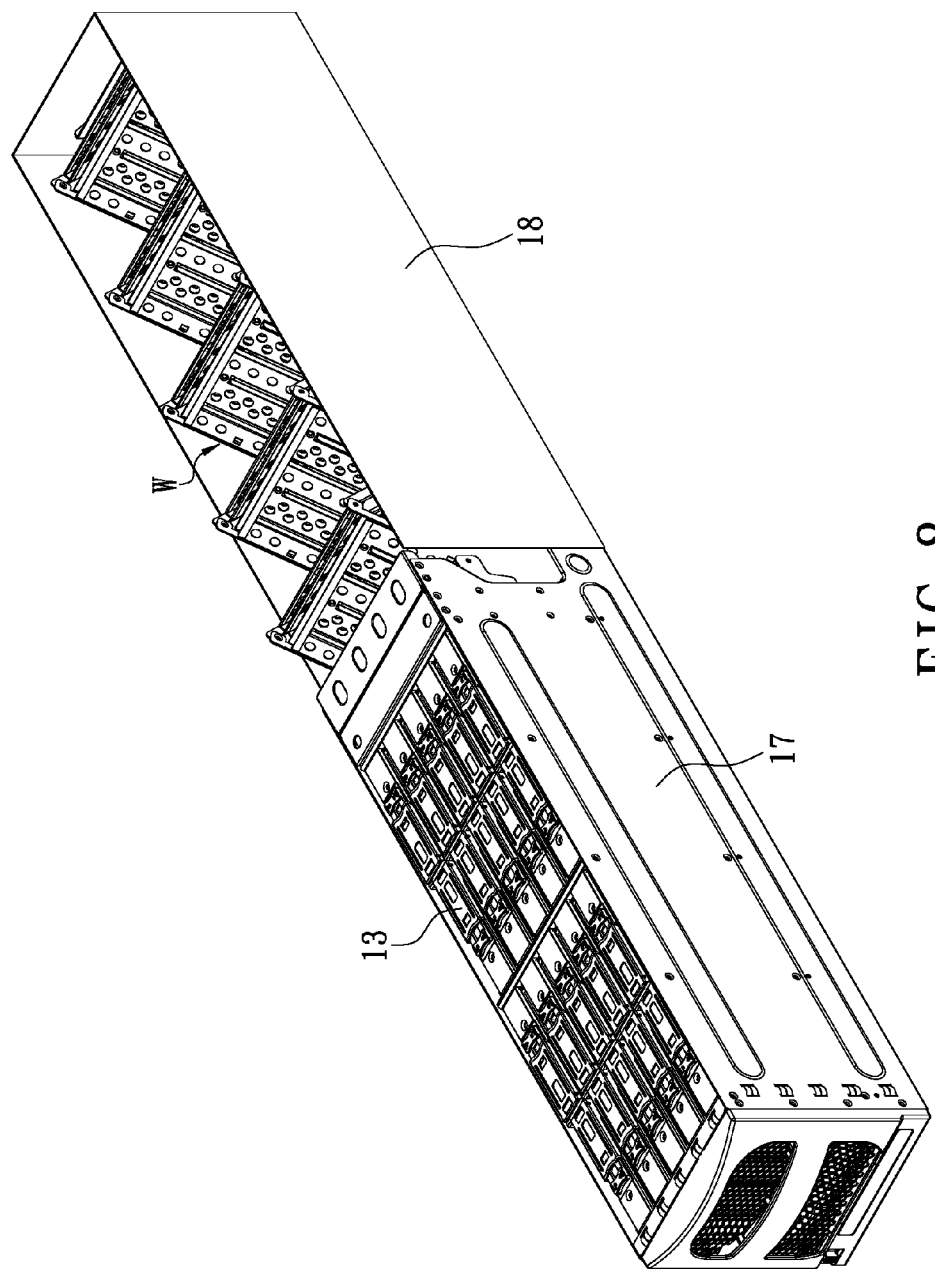
FIG. 8 is a perspective view of a collapsible cable management arm adapted in an industrial computer server in accordance with an embodiment of the instant disclosure.

Please refer to FIG. 8 of another embodiment of the instant disclosure. The collapsible cable management arm W is utilized in an industrial computer server where hard disk drives 13 are stacked compactly on one another and arranged in a tray 17. The power and signal cables L (please refer to FIGS. 6 and 7) of each of the hard disk drives 13 are neatly retained in the collapsible cable rack W. When the tray 17 is pulled out from a main body 18, the collapsible cable rack W stretches along with the tray 17. In other words, the cables L follow the motion of the collapsible cable rack W and are drawn out in a well organized fashion. As the tray 17 returns to the main body 18, the collapsible cable rack W retracts and tidily folds up the cables L therein to a relatively small volume. Moreover, the collapsible cable rack W allows easier and more flexible access to a single hard disk drive 13. Typically, the maintenance of a single hard disk drive in the industrial computer server requires partial cable disconnection so to draw out the tray for easy access. In the instant embodiment, if one of the hard disk drive 13 is out of order, the tray 17 is pulled out and the hard disk drive 13 undergoes hot removal/insertion without disturbing the rest. That is to say, the power and signal cables L remain connected as usual, thus causing minimum interruption.

In summary, the collapsible cable management arm W is foldable and having heat dissipation system so to minimize the storage space of the cables L and facilitate thermal radiation. Additionally, the collapsible cable management arm W provides flexible cable organization thus allowing easy access to associated equipment.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A rack for supporting cables comprising:
a primary plate including at least one primary spacer and a primary positioning portion,
   the primary positioning portion including a pair of primary positioning rails each having a head end and a tail end, symmetrically arranged on the opposite sides of the primary plate and substantially perpendicular thereto,
   wherein the head ends are arranged on first rotational axis,
   wherein the tail ends are arranged on a second rotational axis; and
a secondary plate including a secondary positioning portion including a pair of secondary positioning rails respectively arranged on the opposite sides of the secondary plate and substantially perpendicular thereto;
   wherein the primary and the secondary plates are stackingly coupled with the primary and secondary positioning rails aligningly arranged and contacting each other,
   wherein the primary and secondary plates are held apart by the primary spacer, thereby forming a hollow compartment as a cable passage there-between along the primary and secondary positioning rails.

2. The rack for supporting cables according to claim 1, wherein the primary plate has at least one primary partition extending inward toward the hollow compartment and the secondary plate has at least one secondary partition extending inward toward the hollow compartment, wherein the primary and secondary partitions are spaced apart to allow at least one connection compartment there-between and divide the hollow compartment to at least two cable compartments.

3. The rack for supporting cables according to claim 2, wherein the primary plate and the first axis are co-planar and the secondary plate and the second axis are co-planar.

4. The rack for supporting cables according to claim 3, wherein the primary and secondary plates have a plurality of apertures thereon respectively.

5. The rack for supporting cables according to claim 4, wherein the primary and secondary plates are interconnected by screws.

6. The rack for supporting cables according to claim 4, wherein the primary and secondary plates are interconnected by tenon.

7. A collapsible cable management arm comprises a plurality of the racks according to claim 5 connected pivotally.

8. The collapsible cable management arm according to claim 7, wherein the head ends of one of the racks respectively defines a first head end and a second head end, and
   the head ends of another one of the racks adjacent to the one of the racks respectively defines an another first head end and an another second head end, wherein the first head end and the second head end are respectively connected to the another second head end and the another first head end.

9. The collapsible cable management arm according to claim 7, wherein the tail ends of one of the racks respectively defines a first tail end and a second tail end, and
   the tail ends of another one of the racks adjacent to the one of the racks respectively defines an another first tail end and an another second tail end, wherein the first tail end and the second tail end are respectively connected to the another second tail end and the another first tail end.

10. The collapsible cable management arm according to claim 7, further comprising a first holder and a second holder wherein the first and second holders are fixed on fastening seats respectively.

11. A collapsible cable management arm comprises a plurality of the racks according to claim 6 connected pivotally.

12. The collapsible cable management arm according to claim 11, wherein the head ends of one of the racks respectively defines a first head end and a second head end, and
   the head ends of another one of the racks adjacent to the one of the racks respectively defines an another first head end and an another second head end, wherein the first head end and the second head end are respectively connected to the another second head end and the another first head end.

13. The collapsible cable management arm according to claim 11, wherein the tail ends of one of the racks respectively defines a first tail end and a second tail end, and
   the tail ends of another one of the racks adjacent to the one of the racks respectively defines an another first tail end and an another second tail end, wherein the first tail end and the second tail end are respectively connected to the another second tail end and the another first tail end.

14. The collapsible cable management arm according to claim 11, further comprising a first holder and a second holder wherein the first and second holders are fixed on fastening seats respectively.

15. A collapsible cable management arm comprises a plurality of the racks according to claim 1 connected pivotally.

16. The collapsible cable management arm according to claim 15, wherein the head ends of one of the racks respectively defines a first head end and a second head end, and
   the head ends of another one of the racks adjacent to the one of the racks respectively defines an another first head end and an another second head end, wherein the first head end and the second head end are respectively connected to the another second head end and the another first head end.

17. The collapsible cable management arm according to claim 15, wherein the tail ends of one of the racks respectively defines a first tail end and a second tail end, and
   the tail ends of another one of the racks adjacent to the one of the racks respectively defines an another first tail end and an another second tail end, wherein the first tail end and the second tail end are respectively connected to the another second tail end and the another first tail end.

18. The collapsible cable management arm according to claim 15, further comprising a first holder and a second holder wherein the first and second holders are fixed on fastening seats respectively.

* * * * *